United States Patent
Katz

(12) United States Patent (10) Patent No.: US 7,212,139 B1
Katz (45) Date of Patent: May 1, 2007

(54) SYSTEM FOR SUPPRESSING ALIASING INTERFERERS IN DECIMATING AND SUB-SAMPLING SYSTEMS

(75) Inventor: Ran Katz, Givataim (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/274,964

(22) Filed: Nov. 15, 2005

(51) Int. Cl.
*H03M 1/00* (2006.01)

(52) U.S. Cl. ........................ 341/123; 341/122

(58) Field of Classification Search ............... 341/143, 341/144, 120, 122, 123, 155; 708/313, 300, 708/301, 303
See application file for complete search history.

(56) References Cited

U.S. PATENT DOCUMENTS 6,760,673 B2 * 7/2004 Genther et al. ............. 702/75
6,856,925 B2 * 2/2005 Muhammad et al. ......... 702/75

* cited by examiner

*Primary Examiner*—Brian Young
(74) *Attorney, Agent, or Firm*—Dolly Y. Wu; W. James Brady III; Frederick J. Telecky, Jr.

(57) ABSTRACT

A novel and useful method and apparatus for suppressing aliasing interferers in decimating and sub-sampling discrete time systems. The present invention is operative to reduce the requirements for or completely eliminate the need for the anti-aliasing filter by dynamically modifying the sub-sampling rate (or decimation ratio). Rather than maintain a constant sampling rate (or decimation ratio), the sampling rate (or decimation ratio) is randomized such that its average remains at the nominal value and the effective jitter is low enough for the low rate (or low decimation ratio) system to tolerate. This smears or spreads interfering signals across the spectrum resulting in a noise floor at a significantly reduced level much lower than that of the original interferer signal. The interfering signals are reduced to background noise wherein the level of the resulting noise floor is not nearly as strong as the original interfering signal. Aliasing interferers are effectively suppressed by spreading the energy of the interfering signals out over a wider spectrum.

38 Claims, 2 Drawing Sheets

SYSTEM FOR SUPPRESSING ALIASING INTERFERERS IN DECIMATING AND SUB-SAMPLING SYSTEMS

FIELD OF THE INVENTION

The present invention relates to the field of data communications and more particularly relates to an apparatus and method for suppressing aliasing interferers in decimating and sub-sampling systems.

BACKGROUND OF THE INVENTION

In sub-sampling and sample rate decimating discrete time systems it is necessary to suppress interferers whose frequencies fall within the aliasing bandwidths of the particular system. For this reason, anti-aliasing filters are used to suppress these interferers. The requirements of these anti-aliasing filters, however, are typically very demanding due to the level of interference encountered, bandwidths of the desired and interfering signals, desired suppression, etc. The demanding requirements of the anti-aliasing filter typically results in having to design in costly analog filters or high gate count digital filters. In some cases, it is too cost prohibitive to include an anti-aliasing filter in the system and performance is therefore compromised, for example, in very low cost consumer applications.

A block diagram illustrating an example prior art decimation circuit where an interfering signal is combined with a desired signal to generate an alias bandwidth at the output is shown in FIG. 1. The circuit, generally referenced 100, is a test circuit constructed to demonstrate the problems associated with the prior art. The circuit 100 comprises a desired signal generator input 102, interfering signal generator 104, amplifier 106, summer 108, optional low pass filter (LPF) 110, decimation by 32 112, integrator 114 and display 116.

In this example test circuit, the desired signal having a frequency of 0.4 Hz and an interfering signal at 74.4 Hz are both sampled at 2.4 kHz and summed together at summer 108. A diagram illustrating the frequency spectrum of the input to the prior art decimation circuit of FIG. 1 including the desired and interfering signals is shown in FIG. 2. The frequency spectrum shown represents the signal at the output of the summer 108. The desired signal 200 is centered around 0.4 Hz and the interferer signal 202 is at 74.4 Hz. Note that if 30 dB suppression is desired a 30 dB low pass filter (110 in FIG. 1) is required to sufficiently suppress the interferer signal.

Consider the circuit 100 without optional filter 110. Since there is no filter, the input signal must be sampled at twice the maximum frequency, i.e. the Nyquist rate. As the sampling rate is decreased, the more signals fold into the bandwidth of interest and interfere with the desired signal. Therefore, an anti-aliasing filter is required before the decimation block 112.

The summed signal is then injected into the downsample by 32 block 112 thus yielding an effective sampling rate of 75 Hz, i.e. 2400 Hz/32. The output of the decimation block is analyzed and presented on the display. A diagram illustrating the frequency spectrum of the output from the prior art decimation circuit of FIG. 1 including the desired and interfering signals is shown in FIG. 3. The peak 300 represents the original desired 0.4 Hz signal and the peak 302 represents the aliased 74.4 Hz signal. Due to the decimation and resulting effective sampling rate of 75 Hz, the interfering signal has folded very close to the desired signal lying only 0.2 Hz away. It is important to note that if the interferer signal had a frequency of 74.6 Hz, it would have folded directly on top of the desired signal. Clearly, this situation is not desirable and in most systems, an anti-aliasing filter would have to be introduced before the decimation. A disadvantage, however, is that good (i.e. high suppression) filters are costly in terms of complexity, size and current consumption.

Bluetooth is a worldwide specification for a small low-cost radio. Bluetooth networks are intended to link mobile computers, mobile phones, other portable handheld devices and provide Internet connectivity. Bluetooth uses a packet switching protocol employing frequency hopping at 1600 hops/s with a maximum data rate of 1 Mb/s. Bluetooth radios operate in the unlicensed ISM band at 2.4 GHz. A frequency hop transceiver is used to combat interference and fading and a shaped, binary FM modulation is applied to minimize transceiver complexity. The symbol rate is 1 Ms/s. For full duplex transmission, a Time-Division Duplex (TDD) scheme is used. On the channel, information is exchanged through packets. Each packet is transmitted on a different hop frequency. A packet nominally covers a single slot, but can be extended to cover up to five slots.

The slotted channel is divided into time slots, each having a nominal slot length of 625 µs. The time slots are numbered according to the Bluetooth clock of the piconet master. The slot numbering ranges from 0 to $2^{27}-1$ and is cyclic with a cycle length of $2^{27}$. In the time slots, master and slave can transmit packets. A time-division duplex (TDD) scheme is used where master and slave alternatively transmit. The master starts its transmission in even-numbered time slots only, and the slave starts its transmission in odd-numbered time slots only. The packet start is aligned with the slot start.

Consider a Bluetooth receiver implemented as a sub-sampling system. According to the Nyquist theorem proper sampling requires the input be sampled at least at twice the highest frequency, i.e. the Nyquist sampling rate, otherwise aliasing problems will be introduced. Often times and in the case of Bluetooth, sampling at twice the highest frequency is very difficult to do since the input has a very wide bandwidth requiring sampling at very high speeds. To get around this, the input is instead sampled at lower speeds and a filter is placed at the front to reduce the bandwidth of interest. The filter removes potentially interfering signals that would otherwise be problematic after sampling. The problem, however, is that often very narrow band filters are required which are very expensive in terms of complexity, size and cost.

There is thus a need for a mechanism to either eliminate or reduce the requirements of the anti-aliasing filter that is required to remove interfering signals from the output signal in decimating and sub-sampling discrete time systems.

SUMMARY OF THE INVENTION

The present invention provides a solution to the problems of the prior art by providing a method and apparatus for suppressing aliasing interferers in discrete time decimating and sub-sampling systems. The invention is applicable for use in numerous types of systems and is particular applicable to sub-sampling and sample rate decimating discrete time systems. For example, the invention is applicable in TDM applications such as Bluetooth environments. The invention can be used to eliminate altogether the need for a costly anti-aliasing filter having demanding requirements. Alternatively, the present invention can be used to significantly reduce the requirements of the anti-aliasing thus reducing its complexity, cost, size, etc.

The present invention is operative to reduce the requirements for or completely eliminate the need for the anti-aliasing filter by modifying the sub-sampling rate (or decimation ratio). Considering an input bandwidth having a maximum frequency $f_{max}$, without an anti-aliasing filter, the input must be sampled at a rate at least twice the maximum frequency $f_{max}$. If it is desired to sample at a lower rate, the lower the sampling rate the more unwanted signals fold in and interfere with the desired signal. In accordance with the invention, rather than maintain a constant sampling rate, however, the sampling rate is dynamically changed on a sample-by-sample basis, for example. The sampling rate is dynamically modified to values within a predetermined range. This causes the interfering signal to fold in at a different frequency at each cycle. Moving the sampling frequency around causes interfering signals to be smeared or spread across the spectrum as a significantly reduced level. As a result of the constantly changing sampling frequency, the interfering signals are reduced to background noise. The level of the resulting noise floor is not nearly as strong as the original interfering signal.

A requirement, however, is that the sampling frequency always remain above at least twice the maximum frequency of the desired signal. If this is maintained, the desired signal will not be affected by the constantly changing sampling frequency. The interfering signal, however, will be spread across the spectrum due to the aliasing affect of the lower sampling frequency. The range of sampling frequencies should be selected such that the average sampling frequency is equal to the desired sampling rate. Consider sampling at a frequency of $2f_1$ during one cycle and then sampling at a frequency of $2f_1+\Delta$ at the next cycle. The sequence and actual sampling frequencies are not critical as long as the average sampling frequency is maintained at the desired sampling rate. The sampling frequency is randomized over time symmetrically around a mean value. It is ensured that the lower end of the range of sampling frequencies is higher than twice the maximum frequency of the desired signal.

The present invention effectively suppresses aliasing interferers by spreading the energy of the interfering signal out over a wider spectrum. The sampling frequency is selected at random as long as the sampling frequency is larger then $2f_1$ and has a known mean equal to the final desired sampling rate. This prevents interfering energy buildup at any one frequency. Further, the spreading factor is controlled by the range. The larger the range of sampling frequencies, the larger the interference spreading factor resulting in lower noise levels.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a method for suppressing aliasing interferers in a sub-sampling system having a sub-sampling ratio, the method comprising the steps of providing control means for controlling the sub-sampling ratio of the sub-sampling system, randomizing the sub-sampling ratio such that an average sub-sampling ratio is substantially maintained at a desired nominal ratio and configuring the control means in accordance with the random sub-sampling ratio.

There is also provided in accordance with the invention, a method for suppressing aliasing interferers in a decimating system having a decimation ratio, the method comprising the steps of providing control means for controlling the decimation ratio of the system, randomizing the decimation ratio such that an average decimation ratio is substantially maintained at a desired nominal ratio and configuring the control means in accordance with the random decimation ratio.

There is further provided in accordance with the invention, an apparatus for suppressing aliasing interferers in a sub-sampling system having a sub-sampling ratio comprising a clock source adapted to generate a sampling frequency for use in the sub-sampling system, randomization means for generating a random sampling frequency control value within a certain range such that an average sub-sampling ratio is substantially maintained at a desired nominal ratio and means for configuring the clock source in accordance with the random sampling frequency control value.

There is also provided in accordance with the invention, an apparatus for suppressing aliasing interferers in a decimating system having a decimation ratio comprising a dynamic decimator adapted to decimate an input signal in accordance with a decimation control signal, randomization means for generating a random decimation control value within a certain range such that an average decimation ratio is substantially maintained at a desired nominal ratio and means for configuring the dynamic decimator in accordance with the random decimation control value.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
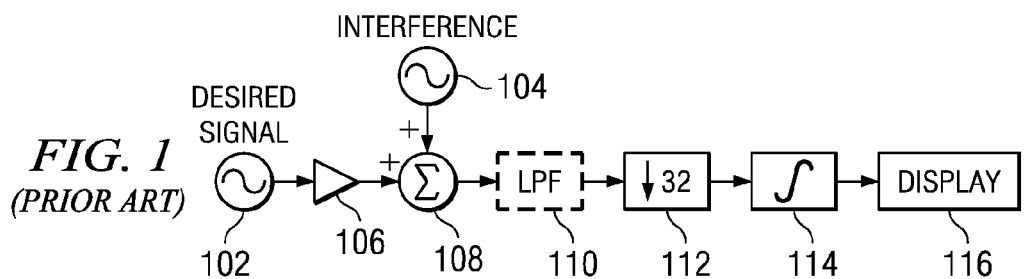
FIG. 1 is a block diagram illustrating an example prior art decimation circuit where an interfering signal is combined with a desired signal to generate an alias bandwidth at the output.
Figure 2:
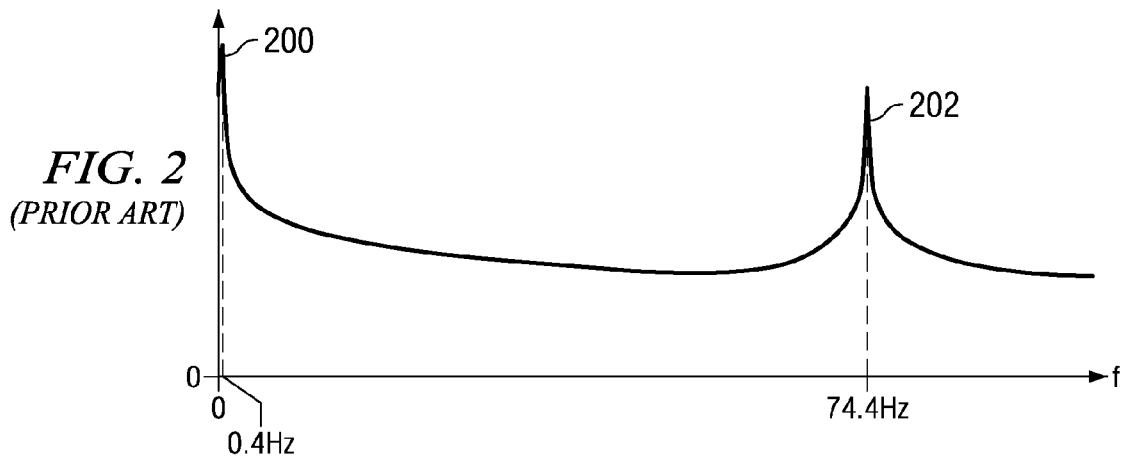
FIG. 2 is a diagram illustrating the frequency spectrum of the input to the prior art decimation circuit of FIG. 1 including the desired and interfering signals.

The following notation is used throughout this document.

| Term | Definition |
| --- | --- |
| A/D | Analog to Digital |
| ASIC | Application Specific Integrated Circuit |
| C/N | Carrier to Noise |
| DSP | Digital Signal Processor |
| FPGA | Field Programmable Gate Array |
| HDL | Hardware Description Language |
| ISM | Industrial Scientific Medical |
| LO | Local Oscillator |
| LPF | Low Pass Filter |
| TDD | Time Division Duplex |

DETAILED DESCRIPTION OF THE INVENTION

The present invention is a method and apparatus for suppressing aliasing interferers in decimating and sub-sampling systems. The invention is applicable for use in numerous types of systems and is particular applicable to sub-sampling and sample rate decimating discrete time systems. For example, the invention is applicable in TDM applications such as Bluetooth environments. The invention can be used to eliminate altogether the need for a costly anti-aliasing filter having demanding requirements. Alternatively, the present invention can be used to significantly reduce the requirements of the anti-aliasing thus reducing its complexity, cost, size, etc.

The present invention is operative to reduce the requirements for or completely eliminate the need for the anti-aliasing filter by modifying the sub-sampling rate (or decimation ratio). Considering an input bandwidth having a maximum frequency $f_{max}$, without an anti-aliasing filter, the input must be sampled at a rate at least twice the maximum frequency $f_{max}$. If it is desired to sample at a lower rate, the lower the sampling rate the more unwanted signals fold in and interfere with the desired signal. In accordance with the invention, rather than maintain a constant sampling rate, however, the sampling rate is dynamically changed on a sample-by-sample basis, for example. The sampling rate is dynamically modified to values within a predetermined range. This causes the interfering signal to fold in at a different frequency at each cycle. Moving the sampling frequency around causes interfering signals to be smeared or spread across the spectrum as a significantly reduced level. As a result of the constantly changing sampling frequency, the interfering signals are reduced to background noise. The level of the resulting noise floor is not nearly as strong as the original interfering signal.

A requirement, however, is that the sampling frequency always remain above at least twice the maximum frequency of the desired signal. If this is maintained, the desired signal will not be affected by the constantly changing sampling frequency. The interfering signal, however, will be spread across the spectrum due to the aliasing affect of the lower sampling frequency. The range of sampling frequencies should be selected such that the average sampling frequency is equal to the desired sampling rate. Consider sampling at a frequency of $2f_1$ during one cycle and then sampling at a frequency of $2f_1+\Delta$ at the next cycle. The sequence and actual sampling frequencies are not critical as long as the average sampling frequency is maintained at the desired sampling rate. The sampling frequency is randomized over time symmetrically around a mean value. It is ensured that the lower end of the range of sampling frequencies is higher than twice the maximum frequency of the desired signal.

The present invention effectively suppresses aliasing interferers by spreading the energy of the interfering signal out over a wider spectrum. The sampling frequency is selected at random as long as the sampling frequency is larger then $2f_1$ and has a known mean equal to the final desired sampling rate. This prevents interfering energy buildup at any one frequency. Further, the spreading factor is controlled by the range. The larger the range of sampling frequencies, the larger the interference spreading factor resulting in lower noise levels.

Figure 4:
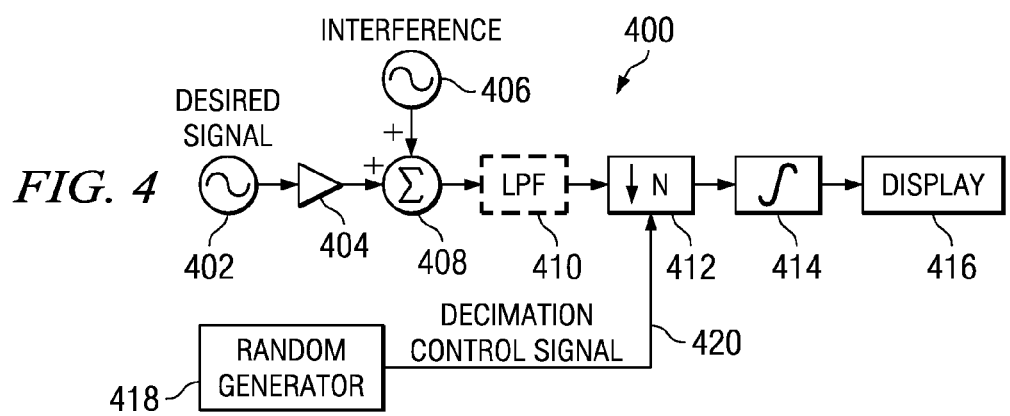
FIG. 4 is a block diagram illustrating an example embodiment of a decimating/sub-sampling system incorporating the decimating/su b-sampling randomization scheme of the present invention.

A block diagram illustrating an example embodiment of a decimating/sub-sampling system incorporating the decimating/sub-sampling randomization scheme of the present invention is shown in FIG. 4. The circuit, generally referenced 400, is a test circuit presented to illustrate the principles of the present invention. The circuit 400, comprises a desired signal generator source 402, interfering signal generator source 406, amplifier 404, summer 408, optional low pass filter 410, decimation block 412, random generator 418, integrator 414 and display 416.

In this test circuit 400, the input signals 402, 406 are the same as in FIG. 1 (102, 104). The downsample by 32 block 112 (FIG. 1) is now replaced with a dynamic decimation block 412 that is controlled by a random generator 418. The random generate may comprise a noise generator or any other device or means adapted to generate a random decimation control signal 420 within a predetermined range of values. The random decimation control signal is input to the dynamic decimation block, which performs the decimation in time in accordance with the decimation control signal. The decimation control signal determines the decimation ratio of the decimation block. In operation, the random generator 418 is operative to generate a uniformly distributed integer value whose mean is equal or substantially equal to the desired decimation ratio. The decimation value corresponding to the output of the random generator is used for the next input sample. Note that each random decimation value generated may be used for any number of input samples. Preferably, a new random decimation value is generated at each input sample cycle.

Considering the decimation by 32 in the example circuit of FIG. 1, the random generator 418 is operative to generate integers uniformly distributed between the values of 29 and 35 and having a mean of 32. The random number generated is input to the dynamic decimation block and used for the next input sample. As described supra, the particular range of +/−3 values in this case determines the extent of suppression of the interfering signal. A larger range yields a large spreading of the interfering signal and consequently lower noise floor. The lower end of the decimation range, however, must correspond to at least twice the largest frequency in the desired input signal.

Figure 3:
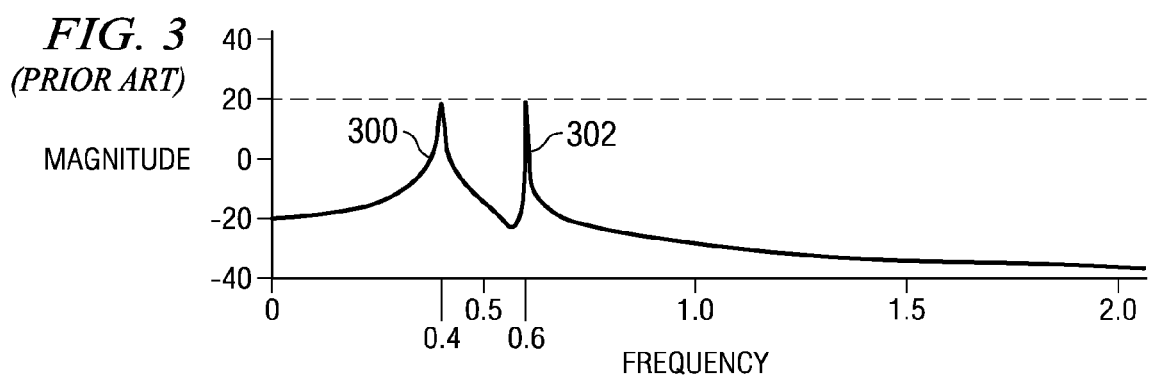
FIG. 3 is a diagram illustrating the frequency spectrum of the output from the prior art decimation circuit of FIG. 1 including the desired and interfering signals.
Figure 5:
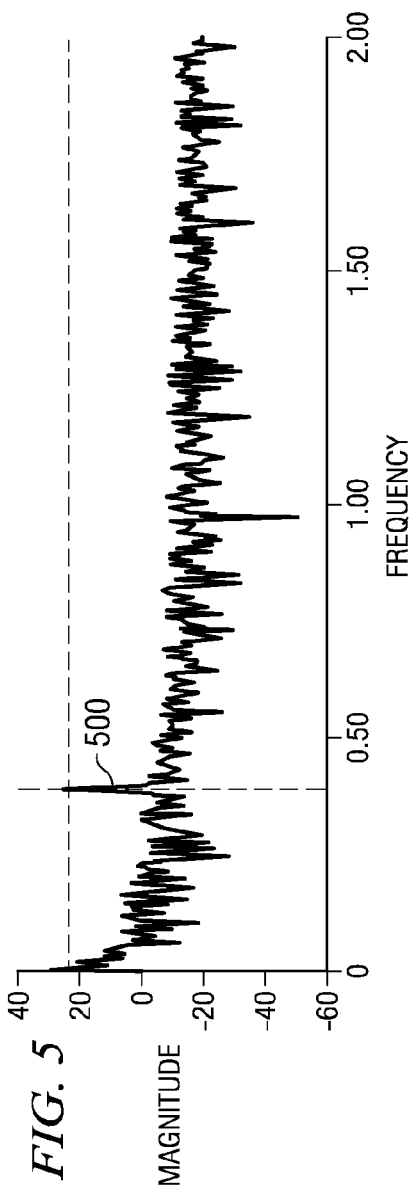
FIG. 5 is a diagram illustrating the frequency spectrum of the signal output from the example embodiment of FIG. 4.

A diagram illustrating the frequency spectrum of the signal output from the example embodiment of FIG. 4 is shown in FIG. 5. The desired signal peak 500 located at 0.4 Hz is at approximately the same level as in the example circuit 100 (FIG. 1) but the interfering signal peak present in FIG. 3 is now no longer present. Instead, a noise floor is present representing the spread or smeared energy of the interfering signal. Assuming this generated noise floor does not compromise the carrier to noise (C/N) requirements of the desired signal, the interfering signal should not affect the performance of the system.

Note that a tradeoff exists in determining the range of random number generation. As the range is increased, the larger the bandwidth over which the interfering signal is spread or smeared resulting in lower noise levels. The range, however, is limited by the Nyquist rate needed to properly sample the high frequencies in the input signal. Thus, the desired spreading gain should be determined first. The spreading gain can then be used to determine the maximum range. The range can then be checked against the Nyquist rate to ensure the proper sampling of the input signal.

It is important to note that although the description of the invention presented above is in the context of a decimation system, the application of the invention is not to be limited to decimation systems. The aliasing interferer suppression scheme of the present invention is also applicable to sub-sampling systems as well. The principles of operation of the invention as the same for sub-sampling systems as they are for decimating systems.

Figure 6:
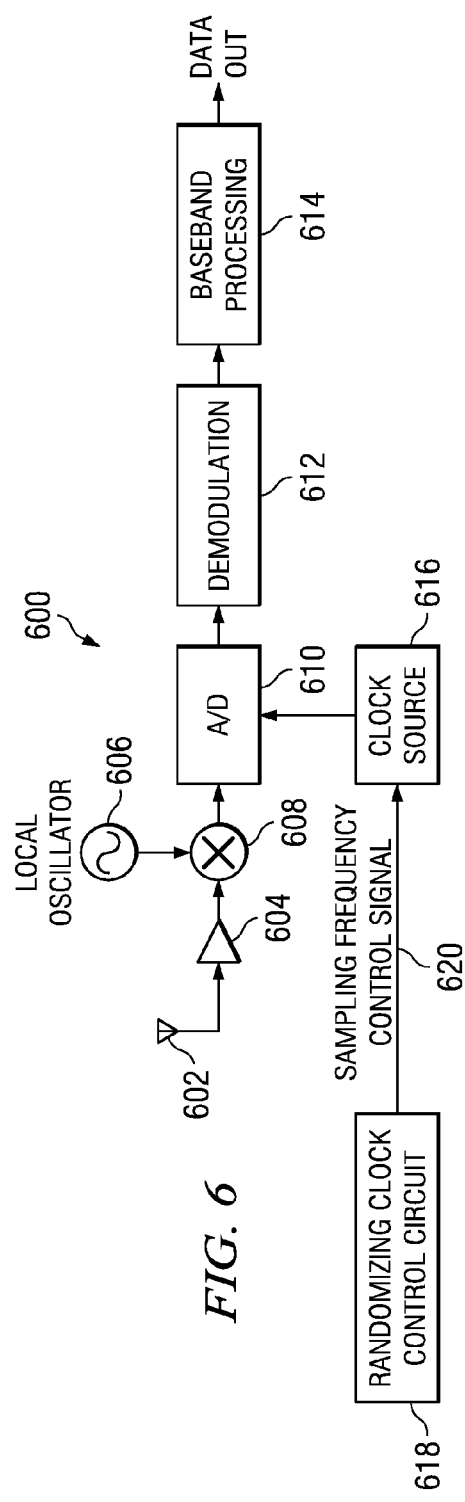
FIG. 6 is a block diagram illustrating an example receiver incorporating the decimating/sub-sampling randomization scheme of the present invention.

To illustrate the application of the invention to sub-sampling systems, an illustrative example will not be presented. A block diagram illustrating an example receiver incorporating the decimating/sub-sampling randomization scheme of the present invention is shown in FIG. 6. The example receiver circuit, generally referenced 600, comprises an antenna 602, low noise amplifier 604, mixer 608, local oscillator (LO) 606, analog to digital converter 610, dynamically configurable A/D clock source 616, randomizing clock control circuit 618, demodulator 612 and based processing block 614.

Similar to the randomization of the decimation ratio in a decimating system, the invention is operative to randomize the sampling frequency in a sub-sampling system. Thus, in operation, the frequency of the clock signal input to the A/D 610 by the clock source 616 is dynamically changed on a random basis. The randomizing clock control circuit 618 is operative to generate a sub-sampling frequency control signal 620 comprising a random value that controls the generation of the clock signal by the clock source. The random value determines the frequency of the clock generated by the clock source. The random sub-sampling frequency is generated within a certain range of frequencies will the mean equal to or substantially equal to the desired sub-sampling frequency.

It is important to note that the dynamic randomization of the sampling frequency performed by the aliasing interferer suppression scheme of the present invention generates some amount of jitter in the output signal. It is appreciated by those skilled in the art, however, that this jitter can be time compensated for since the decimation ratio or the sub-sampling rate is known by the system. Thus, knowledge of the random decimation ratio or sub-sampling frequencies generated can be used to time compensate the output in a deterministic fashion. In some applications, the jitter introduced by the invention may not be of concern. Some factors that determine whether the jitter is a concern include the particular modulation scheme used in the system and the input sensitivity of the receiver.

Thus, the randomization of the sub-sampling rate or decimation ratio should be implemented such that (1) the average sun-sampling rate or decimation ratio remains at the nominal value and (2) the effective jitter generated is sufficiently low enough for the lower rate sampling system or lower decimation ratio system to tolerate. The reduction in sub-sampling rate or decimation ratio will not affect the bandwidth of interest but will effectively spread the energy of the aliasing bandwidth over a much wider bandwidth than the bandwidth of interest, thus effectively suppressing interference from those bands.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method for suppressing aliasing interferers in a sub-sampling system having a sub-sampling ratio, said method comprising the steps of:

providing control means for controlling the sub-sampling ratio of said sub-sampling system;

randomizing the sub-sampling ratio such that an average sub-sampling ratio is substantially maintained at a desired nominal ratio; and configuring said control means in accordance with said random sub-sampling ratio.

2. The method according to claim 1, wherein said step of randomizing is performed at every cycle of said sub-sampling system.

3. The method according to claim 1, wherein the range of sub-sampling ratios generated is uniformly distributed and symmetric around said nominal ratio.

4. The method according to claim 1, wherein the range of sub-sampling ratios is selected such that the effective jitter generated in an output signal of said sub-sampling system can be tolerated.

5. The method according to claim 1, wherein the range of sub-sampling ratios generated is selected such that the energy of an aliasing bandwidth of an interferer is effectively spread over a bandwidth much wider than a bandwidth of interest.

6. The method according to claim 1, wherein increasing the range of the sub-sampling ratios generated causes an aliasing interferer to be spread over a wider bandwidth thereby reducing the level of noise generated by said aliasing interferer.

7. The method according to claim 1, adapted to be implemented in an Application Specific Integrated Circuit (ASIC).

8. The method according to claim 1, adapted to be implemented in a Field Programmable Gate Array (FPGA).

9. A method for suppressing aliasing interferers in a decimating system having a decimation ratio, said method comprising the steps of:

providing control means for controlling the decimation ratio of said system;

randomizing the decimation ratio such that an average decimation ratio is substantially maintained at a desired nominal ratio; and configuring said control means in accordance with said random decimation ratio.

10. The method according to claim 9, wherein said step of randomizing is performed at every cycle of said decimating system.

11. The method according to claim 9, wherein the range of decimation ratios generated is uniformly distributed and symmetric around said nominal ratio.

12. The method according to claim 9, wherein the range of decimation ratios is selected such that the effective jitter generated in an output signal of said decimating system can be tolerated.

13. The method according to claim 9, wherein the range of decimation ratios generated is selected such that the energy of an aliasing bandwidth of an interferer is effectively spread over a bandwidth much wider than a bandwidth of interest.

14. The method according to claim 9, wherein increasing the range of the decimation ratios generated causes an aliasing interferer to be spread over a wider bandwidth thereby reducing the level of noise generated by said aliasing interferer.

15. The method according to claim 9, adapted to be implemented in an Application Specific Integrated Circuit (ASIC).

16. The method according to claim 9, adapted to be implemented in a Field Programmable Gate Array (FPGA).

17. An apparatus for suppressing aliasing interferers in a sub-sampling system having a sub-sampling ratio, comprising:
  a clock source adapted to generate a sampling frequency for use in said sub-sampling system;
  randomization means for generating a random sampling frequency control value within a certain range such that an average sub-sampling ratio is substantially maintained at a desired nominal ratio; and
  means for configuring said clock source in accordance with said random sampling frequency control value.

18. The apparatus according to claim 17, wherein said randomization means is adapted to generate a random sub-sampling ratio every sample cycle.

19. The apparatus according to claim 17, wherein said randomization means is adapted to generate a range of sub-sampling ratios that is uniformly distributed and symmetric around said nominal ratio.

20. The apparatus according to claim 17, wherein said randomization means is adapted to generate a range of sub-sampling ratios such that the effective jitter in an output signal can be tolerated.

21. The apparatus according to claim 17, wherein said randomization means is adapted to generate a range of sub-sampling ratios such that the energy of an aliasing bandwidth of an interferer is effectively spread over a bandwidth much wider than a bandwidth of interest.

22. The apparatus according to claim 17, wherein an increase in the range of the sub-sampling ratios generated by said randomization means causes an aliasing interferer to be spread over a wider bandwidth thereby reducing the level of noise generated by said aliasing interferer.

23. The apparatus according to claim 17, adapted to be implemented in an Application Specific Integrated Circuit (ASIC).

24. The apparatus according to claim 17, adapted to be implemented in a Field Programmable Gate Array (FPGA).

25. An apparatus for suppressing aliasing interferers in a decimating system having a decimation ratio, comprising:
  a dynamic decimator adapted to decimate an input signal in accordance with a decimation control signal;
  randomization means for generating a random decimation control value within a certain range such that an average decimation ratio is substantially maintained at a desired nominal ratio; and
  means for configuring said dynamic decimator in accordance with said random decimation control value.

26. The apparatus according to claim 25, wherein said randomization means is adapted to generate a random decimation ratio every sample cycle.

27. The apparatus according to claim 25, wherein said randomization means is adapted to generate a range of decimation ratios that is uniformly distributed and symmetric around said nominal ratio.

28. The apparatus according to claim 25, wherein said randomization means is adapted to generate a range of decimation ratios such that the effective jitter in an output signal can be tolerated.

29. The apparatus according to claim 25, wherein said randomization means is adapted to generate a range of decimation ratios such that the energy of an aliasing bandwidth of an interferer is effectively spread over a bandwidth much wider than a bandwidth of interest.

30. The apparatus according to claim 25, wherein an increase in the range of the decimation ratios generated by said randomization means causes an aliasing interferer to be spread over a wider bandwidth thereby reducing the level of noise generated by said aliasing interferer.

31. The apparatus according to claim 25, adapted to be implemented in an Application Specific Integrated Circuit (ASIC).

32. The apparatus according to claim 25, adapted to be implemented in a Field Programmable Gate Array (FPGA).

33. A circuit receiving an input signal with an input frequency, comprising:
  a sub-sampling system having a sub-sampling ratio;
  a clock circuit adapted to generate a sampling frequency for use in the sub-sampling system;
  a random generator circuit adapted to provide a random sampling frequency control value within a certain range such that an average of the sub-sampling ratio is substantially maintained at a desired nominal ratio; wherein a low end of the certain range is at least twice the input frequency of the input signal; and
  a control circuit adapted to adjust said clock circuit in accordance with said random sampling frequency control value.

34. A circuit receiving an input signal with an input frequency, comprising:
  a decimating system having a decimation ratio;
  a clock circuit adapted to generate a sampling frequency for use in the decimating system;
  a random generator circuit adapted to provide a random sampling frequency control value within a certain range such that an average of the decimation ratio is substantially maintained at a desired nominal ratio; and a low end of the certain range is at least twice the input frequency of the input signal; and
  a control circuit adapted to adjust said clock circuit in accordance with said random sampling frequency control value.

35. The circuit according to claim 33, wherein the random generator circuit is adapted to generate a random sampling frequency control value every sample cycle.

36. The circuit according to claim 34, wherein the random generator circuit is adapted to generate a random sampling frequency control value every sample cycle.

37. The circuit according to claim 33, wherein the certain range is uniform and symmetric around the desired nominal ratio.

38. The circuit according to claim 34, wherein the certain range is uniform and symmetric around the desired nominal ratio.

* * * * *